(12) United States Patent
Nakano

(10) Patent No.: US 11,311,918 B2
(45) Date of Patent: Apr. 26, 2022

(54) SUBSTRATE CLEANING APPARATUS AND SUBSTRATE CLEANING METHOD

(71) Applicant: Ebara Corporation, Tokyo (JP)

(72) Inventor: Hisajiro Nakano, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 16/934,378

(22) Filed: Jul. 21, 2020

(65) Prior Publication Data

US 2021/0023592 A1 Jan. 28, 2021

(30) Foreign Application Priority Data

Jul. 22, 2019 (JP) .............................. JP2019-134833

(51) Int. Cl.
| | |
|---|---|
| *B08B 7/04* | (2006.01) |
| *H01L 21/67* | (2006.01) |
| *B08B 1/00* | (2006.01) |
| *B08B 13/00* | (2006.01) |
| *B08B 1/02* | (2006.01) |
| *B08B 3/04* | (2006.01) |

(52) U.S. Cl.
CPC ............... *B08B 7/04* (2013.01); *B08B 1/002* (2013.01); *B08B 1/003* (2013.01); *B08B 1/02* (2013.01); *B08B 3/041* (2013.01); *B08B 13/00* (2013.01); *H01L 21/67034* (2013.01)

(58) Field of Classification Search
CPC ............... H01L 21/67092; H01L 21/68; H01L 21/67046; H01L 21/67219; H01L 21/02041; H01L 21/02096
See application file for complete search history.

(56) References Cited

U.S. PATENT DOCUMENTS 6,155,275 A * 12/2000 Shinbara ........... H01L 21/67046
134/147
10,141,205 B2 * 11/2018 Wang ..................... B08B 1/002

FOREIGN PATENT DOCUMENTS

JP 2000-188274 A 7/2000

* cited by examiner

*Primary Examiner* — Natasha N Campbell
(74) *Attorney, Agent, or Firm* — Leydig Voit and Mayer, Ltd.

(57) ABSTRACT

A substrate cleaning apparatus includes a substrate holding mechanism holding the substrate, a rotation mechanism rotating the substrate held by the substrate holding mechanism, and a cleaning mechanism cleaning the substrate. The cleaning mechanism includes a support column, an arm extending from the support column and having a fixed height position, a cleaning tool supported by the arm and cleaning a surface of the substrate by contacting the surface, a lift mechanism moving the cleaning tool vertically with respect to the arm between an raised position separated from the substrate and a lowered position in contact with the substrate, and a controller controlling at least a speed at which the cleaning tool descends.

9 Claims, 7 Drawing Sheets

SUBSTRATE CLEANING APPARATUS AND SUBSTRATE CLEANING METHOD

CROSS REFERENCE TO RELATED APPLICATION

The present application claims priority based on Japanese Patent Application No. 2019-134833 filed in Japan on Jul. 22, 2019, and the contents of which are incorporated herein by reference.

BACKGROUND OF THE INVENTION

Field of the Invention

The present invention relates to a substrate cleaning apparatus and a substrate cleaning method.

Background Art

An apparatus for cleaning a substrate such as a semiconductor wafer includes, for example, a substrate holding mechanism that holds the substrate, a rotation mechanism that rotates the substrate, and a cleaning mechanism that cleans the substrate. The cleaning mechanism includes an extendable support column, an arm extending horizontally from the support, a cleaning tool supported by the arm, and an lift mechanism lift the cleaning tool (for example, see Japanese Patent Application, First Publication No. 2000-188274).

The substrate cleaning apparatus cleans the surface of the substrate by lowering the cleaning tool such as by shortening the support column and rotating the substrate in contact with the surface of the substrate.

In the above-described substrate cleaning apparatus, since a structure for supporting the cleaning tool (support column and the like) has a complex structure and a large size, a large installation space has been required. Therefore, it was difficult to make design changes such as adding a cleaning mechanism. Furthermore, in the above-described substrate cleaning apparatus, for the protection of the substrate, when a cleaning tool contacts the substrate, suppressing a load applied to the substrate has been required.

SUMMARY OF THE INVENTION

The present invention has been made in view of the above circumstances, and provides a substrate cleaning apparatus and a substrate cleaning method capable of downsizing a structure for supporting a cleaning tool and suppressing a load applied to a substrate by the cleaning tool.

A first aspect of the present invention is a substrate cleaning apparatus including a substrate holding mechanism holding the substrate, a rotation mechanism rotating the substrate held by the substrate holding mechanism, and a cleaning mechanism cleaning the substrate. The cleaning mechanism includes a support column, an arm extending from the support column and having a fixed height position, a cleaning tool supported by the arm and cleaning a surface of the substrate by contacting the surface, a lift mechanism moving the cleaning tool vertically with respect to the arm between an raised position separated from the substrate and a lowered position in contact with the substrate, and a controller controlling at least a speed at which the cleaning tool descends.

According to a second aspect of the present invention, in the substrate cleaning apparatus of the above-described first aspect, it is preferable that the substrate cleaning apparatus further includes a cover surrounding the substrate from an outer peripheral side.

According to a third aspect of the present invention, in the substrate cleaning apparatus of the above-described first or second aspect, it is preferable that the lift mechanism comprises a fluid supplier that supplies a fluid, a cylinder to which the fluid is supplied, and an lift body that adjusts a height of the cleaning tool in accordance with a pressure of the fluid in the cylinder.

According to a fourth aspect of the present invention, in the substrate cleaning apparatus of the above-described third aspect, it is preferable that the controller controls a speed at which the cleaning tool descends by adjusting a supply amount of the fluid to the cylinder.

According to a fifth aspect of the present invention, in the substrate cleaning apparatus of the above-described third or fourth aspect, it is preferable that the lift mechanism further comprises a biasing body biasing the lift body in a direction opposite to a moving direction of the lift body when a pressure of the fluid increases.

According to a sixth aspect of the present invention, in the substrate cleaning apparatus of any one of the above-described first to fifth aspect, it is preferable that by rotating around the support column, the arm is able to switch a cleaning position where the cleaning tool overlaps the substrate when viewed parallel to the thickness direction of the substrate and a retracted position where the cleaning tool is detached from the substrate.

According to a seventh aspect of the present invention, in the substrate cleaning apparatus of any one of the above-described first to sixth aspect, it is preferable that the substrate cleaning apparatus includes a plurality of the cleaning mechanisms.

An eighth aspect of the present invention is a substrate processing apparatus including a substrate polishing apparatus polishing a substrate, and a substrate cleaning apparatus of the above-described seventh aspect, which cleans the substrate polished by the substrate polishing apparatus.

A ninth aspect of the present invention is a substrate cleaning method for cleaning a substrate using the substrate cleaning apparatus of any one of the above-described first to seventh aspect, where the controller controls the speed at which the cleaning tool descends from the raised position to the lowered position so as to be gradually or continuously reduced.

According to the above aspects of the present invention, it is possible to realize an improved substrate cleaning apparatus and substrate cleaning method. In particular, according to the above aspects of the present invention, a structure for supporting the cleaning tool can be downsized, and a load applied to the substrate when the cleaning tool contacts the substrate can be suppressed.

More specifically, in one embodiment of the present invention, the cracking of the substrate can be prevented while ensuring the cleaning quality after a cleaning process using the cleaning tool on an upper surface of the substrate. Therefore, it is possible to continuously perform the cleaning process on a plurality of substrates while ensuring the availability of the substrate processing apparatus including the substrate cleaning apparatus, and it is possible to provide a substrate processing apparatus with an improved operation rate.

DESCRIPTION OF THE PREFERRED EMBODIMENTS

An embodiment of the present invention will be described below with reference to the drawings.

Unless stated otherwise, "upper" indicates a direction in which the cleaning tool is present starting from the substrate, and "lower" indicates an opposite direction thereof. In addition, with respect to the cleaning tool and the constituents thereof, the "upper surface" and the "front surface" indicate a surface on the side where the cleaning tool contacts the substrate.

Figure 1:
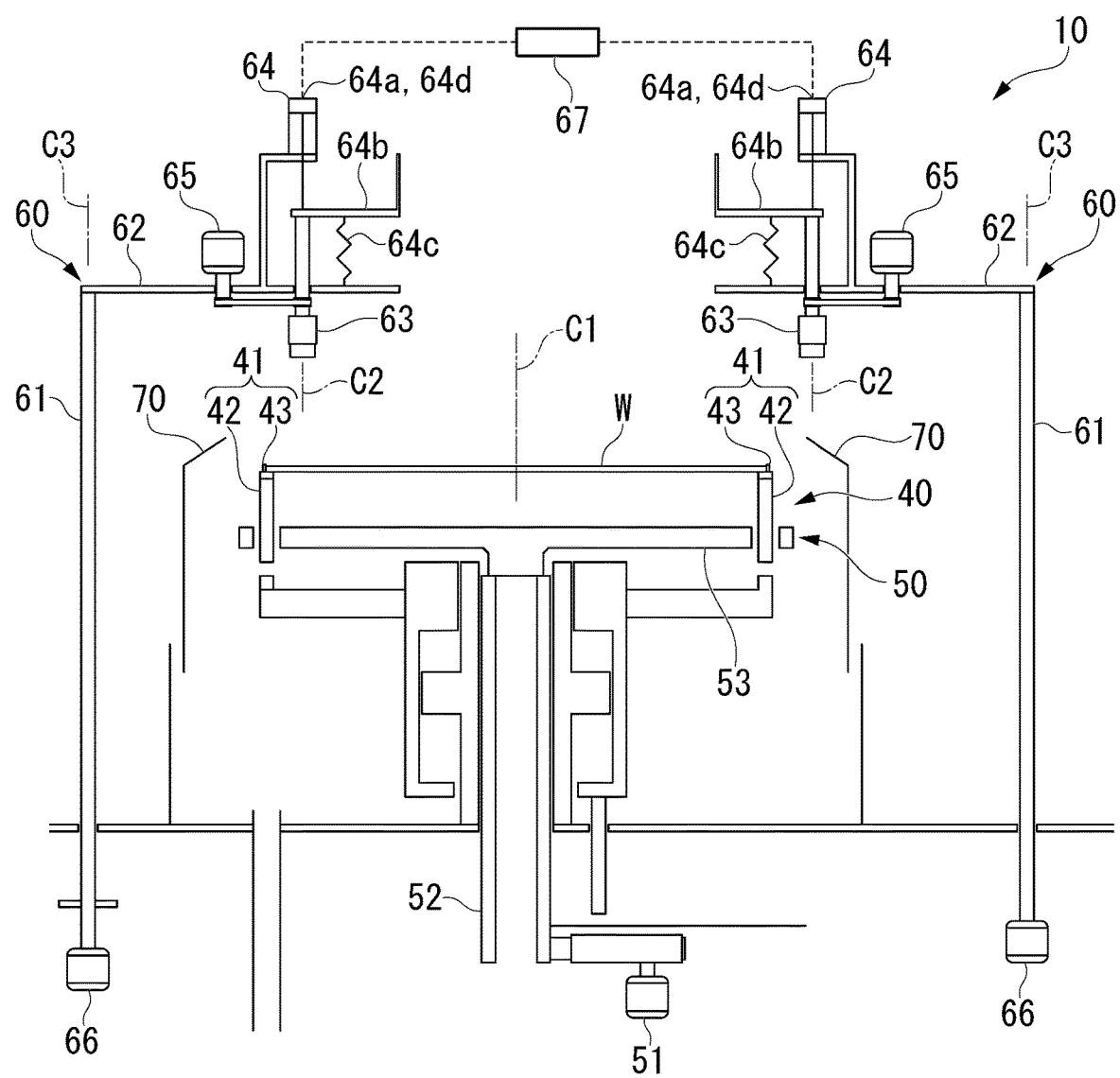
FIG. 1 is a schematic view of a substrate cleaning apparatus of the first embodiment.
Figure 2:
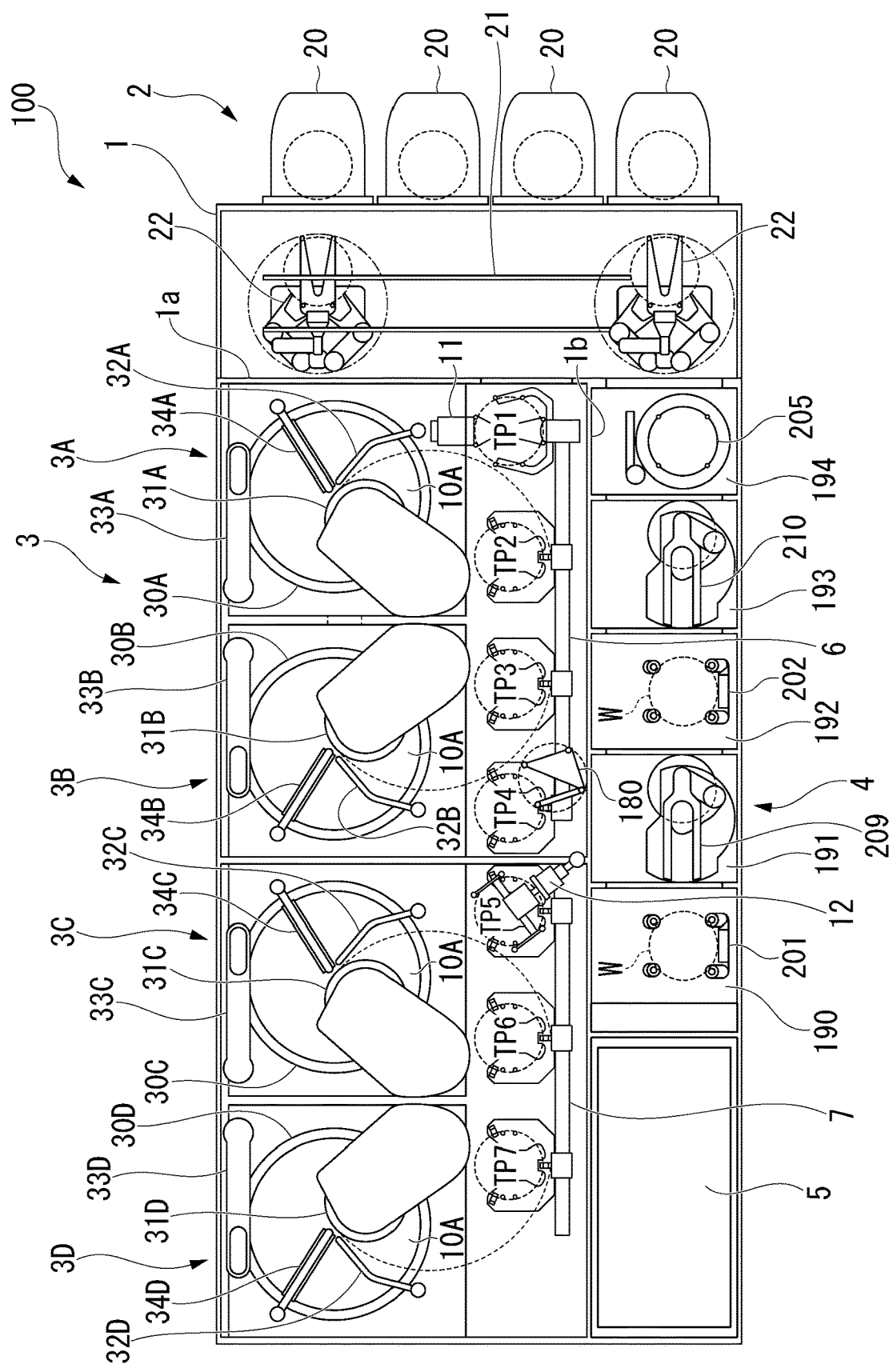
FIG. 2 is a plan view of a substrate processing apparatus using the substrate cleaning apparatus of the first embodiment.

FIG. 1 is a schematic view of a substrate cleaning apparatus 10 according to the first embodiment. FIG. 2 is a plan view of the substrate processing apparatus 100 using the substrate cleaning apparatus 10.

As shown in FIG. 2, the substrate processing apparatus 100 includes a housing 1 having a substantially rectangular shape. The inside of the housing 1 is divided into a loading and unloading portion 2, a polisher 3 and a cleaning section 4 by partition walls 1a and 1b. The loading and unloading portion 2, the polisher 3, and the cleaner 4 are independently assembled and exhausted independently. The substrate processing apparatus 100 has a controller 5 that controls the substrate processing operation.

The loading and unloading portion 2 includes two or more (four in the present embodiment) front loaders 20 on which wafer cassettes stocking a large number of wafers (substrates) are placed. The front loader 20 is arranged adjacent to the housing 1 and aligned along the width direction (direction perpendicular to the longitudinal direction) of the substrate processing apparatus. An open cassette, a Standard Manufacturing Interface (SMIF) pod, or a Front Opening Unified Pod (FOUP) can be mounted on the front loader 20. The SMIF and the FOUP are hermetically sealed containers in which a wafer cassette is accommodated inside and covered with a partition wall to maintain an environment independent of the external space.

A traveling mechanism 21 is laid on the loading and unloading portion 2 along the front loader 20. On the traveling mechanism 21, two transport robots (loaders) 22 that are movable along the arrangement direction of the wafer cassettes are installed. The transport robot 22 can access the wafer cassette mounted on the front loader 20 by moving on the traveling mechanism 21. Each transport robot 22 includes hands at an upper portion and a lower portion thereof. The transport robot 22 uses the upper hand when returning the processed wafer to the wafer cassette. The transport robot 22 uses the lower hand when taking out an unprocessed wafer from the wafer cassette. The lower hand of the transport robot 22 can rotate around its axis to turn over the wafer.

The loading and unloading portion 2 is an area that needs to be kept in the cleanest state. The inside of the loading and unloading portion 2 is constantly maintained at a higher pressure than the outside of the substrate processing apparatus, the polisher 3, and the cleaner 4. The loading and unloading portion 2 is provided with a filter fan unit (not shown) having a clean air filter such as a HEPA filter, a ULPA filter, or a chemical filter. From this filter fan unit, clean air from which particles, toxic vapors, toxic gases, and the like have been removed is constantly blown out.

The polisher 3 is a region where the wafer is polished (flattened), and includes a first polisher 3A, a second polisher 3B, a third polisher 3C, and a fourth polisher 3D. The first polisher 3A, the second polisher 3B, the third polisher 3C, and the fourth polisher 3D are arranged along the longitudinal direction of the substrate processing apparatus 100. In one embodiment, a polisher or a polishing apparatus may mean an apparatus for use in Chemical Mechanical Polishing (CMP) process for planarization of a substrate.

In the present embodiment, since the polisher 3 uses a slurry as a polishing liquid, a negative pressure is formed inside the polisher 3 and the pressure thereof is kept lower than the internal pressure of the cleaning section 4.

The first polisher 3A includes a polishing table 30A, a top ring 31A, a polishing liquid supply nozzle 32A, a dresser 33A, and an atomizer 34A. A polishing pad 10A having a polishing surface is attached to the polishing table 30A. The top ring 31A holds the wafer and polishes the wafer while pressing the wafer against the polishing pad 10A on the polishing table 30A. The polishing liquid supply nozzle 32A supplies the polishing liquid and the dressing liquid (for example, pure water) to the polishing pad 10A. The dresser 33A dresses the polishing surface of the polishing pad 10A. The atomizer 34A atomizes a mixed fluid of a liquid (for example, pure water) and a gas (for example, nitrogen gas) or a liquid (for example, pure water) and sprays it on the polishing surface.

The second polisher 3B includes a polishing table 30B to which the polishing pad 10A is attached, a top ring 31B, a polishing liquid supply nozzle 32B, a dresser 33B, and an atomizer 34B. The third polisher 3C includes a polishing table 30C to which the polishing pad 10A is attached, a top ring 31C, a polishing liquid supply nozzle 32C, a dresser 33C, and an atomizer 34C. The fourth polisher 3D includes a polishing table 30D to which the polishing pad 10A is attached, a top ring 31D, a polishing liquid supply nozzle 32D, a dresser 33D, and an atomizer 34D.

The polishing pad 10A is attached to the upper surface of the polishing table 30A of the first polisher 3A. The upper surface of the polishing pad 10A constitutes a polishing surface for polishing a wafer. The polishing table 30A rotates around its axis. The wafer is held on the lower surface of the top ring 31A by vacuum suction. During polishing, the polishing liquid is supplied from the polishing liquid supply nozzle 32A to the polishing surface of the polishing pad 10A. The wafer to be polished is pressed against the polishing surface of the polishing pad 10A by the top ring 31A and polished.

The second polisher 3B, the third polisher 3C, and the fourth polisher 3D have the same configuration as the first polisher 3A.

A first linear transporter 6 is arranged adjacent to the first polisher 3A and the second polisher 3B. The first linear transporter 6 transports the wafer between four transport positions arranged along the direction in which the polishers 3A and 3B are arranged. The four transport positions are a first transport position TP1, a second transport position TP2, a third transport position TP3, and a fourth transport position TP4, which are sequentially arranged from a site of the loading and unloading portion.

A temporary stand 180 is provided near the first linear transporter 6.

The second linear transporter 7 is arranged adjacent to the third polisher 3C and the fourth polisher 3D. The second linear transporter 7 transports the wafer between three transport positions arranged along the direction in which the polishers 3C and 3D are arranged. The three transport positions are a fifth transport position TP5, a sixth transport position TP6, and a seventh transport position TP7, which are sequentially arranged from a site of the loading and unloading portion.

The wafer is transported to the polishers 3A and 3B by the first linear transporter 6. As described above, the top ring 31A of the first polisher 3A moves between the polishing position and the second transport position TP2. Therefore, the delivery of the wafer to the top ring 31A is performed at the second transport position TP2. Similarly, the top ring 31B of the second polisher 3B moves between the polishing position and the third transport position TP3. The delivery of the wafer to the top ring 31B is performed at the third transport position TP3. The top ring 31C of the third polisher 3C moves between the polishing position and the sixth transport position TP6. The delivery of the wafer to the top ring 31C is performed at the sixth transport position TP6. The top ring 31D of the fourth polisher 3D moves between the polishing position and the seventh transport position TP7. The wafer is transported to the top ring 31D at the seventh transport position TP7.

A lifter 11 that receives a wafer from the transport robot 22 is arranged at the first transport position TP1. The lifter 11 transports the wafer from the transport robot 22 to the first linear transporter 6.

A swing transporter 12 is arranged between the first linear transporter 6, the second linear transporter 7, and the cleaner 4. The swing transporter 12 has a hand that can move between the fourth transport position TP4 and the fifth transport position TP5. The swing transporter 12 transports the wafer from the first linear transporter 6 to the second linear transporter 7. The wafer is transported by the second linear transporter 7 to at least one of the third polisher 3C and the fourth polisher 3D. The wafer polished by the polisher 3 is transported to the cleaner 4 via the swing transporter 12.

The cleaner 4 is divided into a first cleaning chamber 190, a first transport chamber 191, a second cleaning chamber 192, a second transport chamber 193, and a drying chamber 194.

A primary cleaning module 201 is provided in the first cleaning chamber 190. Two primary cleaning modules 201 may be provided in the first cleaning chamber 190 at different height positions, and the two primary cleaning modules may be switched and used. A first transport robot 209 is provided in the first transport chamber 191. A secondary cleaning module 202 is provided in the second cleaning chamber 192. Two secondary cleaning modules 202 may be provided in the second cleaning chamber 192 at different height positions, and the two secondary cleaning modules may be switched and used. A second transport robot 210 is provided in the second transport chamber 193. A drying module 205 is provided in the drying chamber 194. Two drying modules 205 may be provided in the drying chamber 194 at different height positions, and the two drying modules may be switched and used.

The first transport robot 209 transports the wafer W between the temporary table 180, the primary cleaning module 201, and the secondary cleaning module 202. The second transport robot 210 transports the wafer W between the secondary cleaning module 202 and the drying module 205.

The primary cleaning module 201 and the secondary cleaning module 202 are the same in a configuration. As the primary cleaning module 201 and the secondary cleaning module 202, for example, the substrate cleaning apparatus 10 shown in FIG. 1 is used.

As shown in FIG. 1, the substrate cleaning apparatus 10 includes a substrate holding mechanism 40, a rotation mechanism 50, a plurality of cleaning mechanisms 60, and a cover 70.

The positional relationship of each portion of the substrate cleaning apparatus 10 will be described below with reference to FIG. 1. In FIG. 1, the upper surface of the wafer W is a surface to be cleaned. The vertical direction in FIG. 1 is the height direction. The central axis C1 of the substrate holding mechanism 40 extends along the vertical direction, for example. The posture of the substrate cleaning apparatus 10 defined here does not limit the posture when the substrate cleaning apparatus is used.

The substrate holding mechanism 40 includes a plurality of holders 41. The holder 41 includes a base column portion 42 and a lock portion 43. The lock portion 43 is provided on the upper end of the base column portion 42. The lock portion 43 locks on the peripheral portion of the wafer W. The holder 41 holds the wafer W by the lock portion 43 locking the periphery of the wafer W. The plurality of holders 41 are provided at different positions in the circumferential direction of the wafer W.

C1 is the central axis of the substrate holding mechanism 40. The central axis C1 is along the height direction. The substrate holding mechanism 40 holds the wafer W with the central axis of the wafer W aligned with the central axis C1. It is preferable that the substrate holding mechanism 40 can hold the wafer W in a horizontal state.

The structure of the substrate holding mechanism is not particularly limited. For example, instead of the lock portion 43, a cylindrical holder (not shown) that rotates while contacting the peripheral edge portion of the wafer W in a pressed state may be used.

The rotation mechanism 50 includes a driver 51, a rotation shaft 52, and a base 53. The rotation mechanism 50 rotates the rotating shaft 52 and the base 53 around the central axis C1 by the driving portion 51, thereby rotating the holder 41 around the central axis C1. The rotation mechanism 50 rotates the wafer W around the central axis C1 by the rotation of the holder 41. The driver 51 is, for example, a motor.

The rotation mechanism is not particularly limited as long as it can rotate the wafer. The rotation mechanism may include, for example, a plurality of roller-shaped holding bodies. The roller-shaped holding body holds the peripheral edge portion of the wafer W and rotates the wafer W by rotation.

The cleaning mechanism 60 includes a support column 61, an arm 62, a cleaning tool 63, a lift mechanism 64, a cleaning tool rotation mechanism 65, an arm rotator 66, and a controller 67. In one embodiment, the arm rotator 66 is configured by a motor or the like, and can rotate the arm 62 around a predetermined rotation axis based on a control signal from the controller 67.

The support column 61 extends upward from the installation surface, for example. Since the support column 61 is not provided with a telescopic mechanism or a lift mechanism, a structure thereof is simple. Therefore, the installation space required by the support column 61 is small.

The arm 62 extends from the upper end of the support column 61 in a direction intersecting with the support column 61. The arm 62 extends horizontally from the upper end of the support column 61, for example. Since the support column 61 is not provided with a telescopic mechanism, a lift mechanism, or the like, the height position of the upper end of the support column 61 is not changed. Therefore, the height position of the arm 62 does not change. The arm 62 operates while maintaining a constant height position.

The support column 61 and the arm 62 support the cleaning tool 63.

Figure 3:
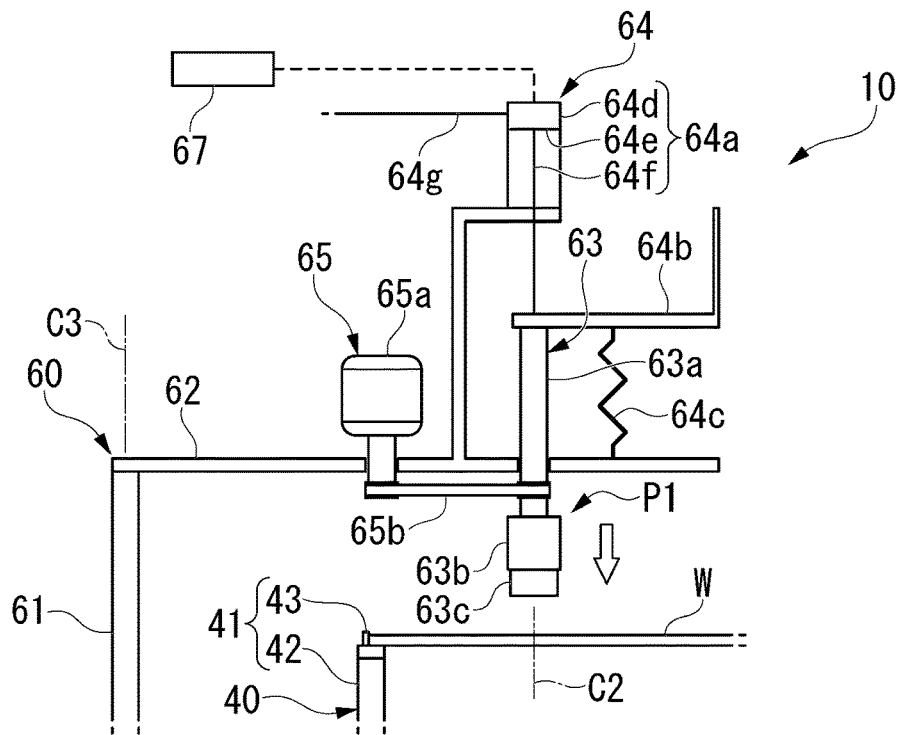
FIG. 3 is a schematic view of a cleaning tool and a lift mechanism.

FIG. 3 is a schematic view of the cleaning tool 63 and the lift mechanism 64.

As shown in FIG. 3, the cleaning tool 63 includes a shaft portion 63a, a holder 63b, and a cleaning member 63c. The shaft portion 63a has a central axis C2 that is parallel to the central axis C1. The holder 63b is provided at the lower end of the shaft portion 63a. The holder 63b holds the cleaning member 63c. The cleaning member 63c is, for example, an elastic material having a liquid absorbing property. The cleaning member 63c is made of, for example, a porous resin material. Examples of the resin material forming the cleaning member 63c include polyvinyl formal (PVF), polyvinyl alcohol (PVA), and foamed polyurethane. The cleaning member 63c is formed, for example, in a cylindrical shape having a central axis along the central axis C2. The cleaning member 63c contacts the main surface (upper surface) of the wafer W to clean the main surface. The cleaning tool 63 can rotate around the central axis C2 of the shaft portion 63a. The cleaning tool 63 is a cleaning tool called "pen type" or "pencil type". The cleaning tool 63 can move up and down.

The lift mechanism 64 includes a lift driver 64a, a support body 64b, and a biasing body 64c.

The lift driver 64a includes, for example, a fluid supplier (not shown), a cylinder 64d, a lift body 64e, and a connection portion 64f. The above-described fluid supplier is a source of fluid such as air. Fluid is supplied to the cylinder 64d from the fluid supplier through the supply path 64g. The lift body 64e is provided in the cylinder 64d so as to be vertically movable. The lift body 64e can be moved up and down according to the pressure of the fluid in the cylinder 64d to adjust the height position of the cleaning tool 63. For example, when the pressure inside the cylinder 64d rises, the lift body 64e descends. The fluid is preferably a gas. The connection portion 64f connects the lift body 64e and the support body 64b.

The support body 64b is connected to the upper end of the shaft portion 63a of the cleaning tool 63. The support body 64b extends in a direction (for example, a horizontal direction) intersecting the shaft portion 63a. The urging body 64c is located higher than the arm 62. The support body 64b is located at a position facing a portion of the arm 62.

The biasing body 64c is, for example, an elastic body such as a coil spring. The upper end of the biasing body 64c is attached to the support body 64b. The lower end of the biasing body 64c is attached to the arm 62. The biasing body 64c can urge the lift body 64e in a direction opposite to the moving direction (that is, downward) of the lift body 64e when the pressure of the fluid in the cylinder 64d rises.

Figure 4:
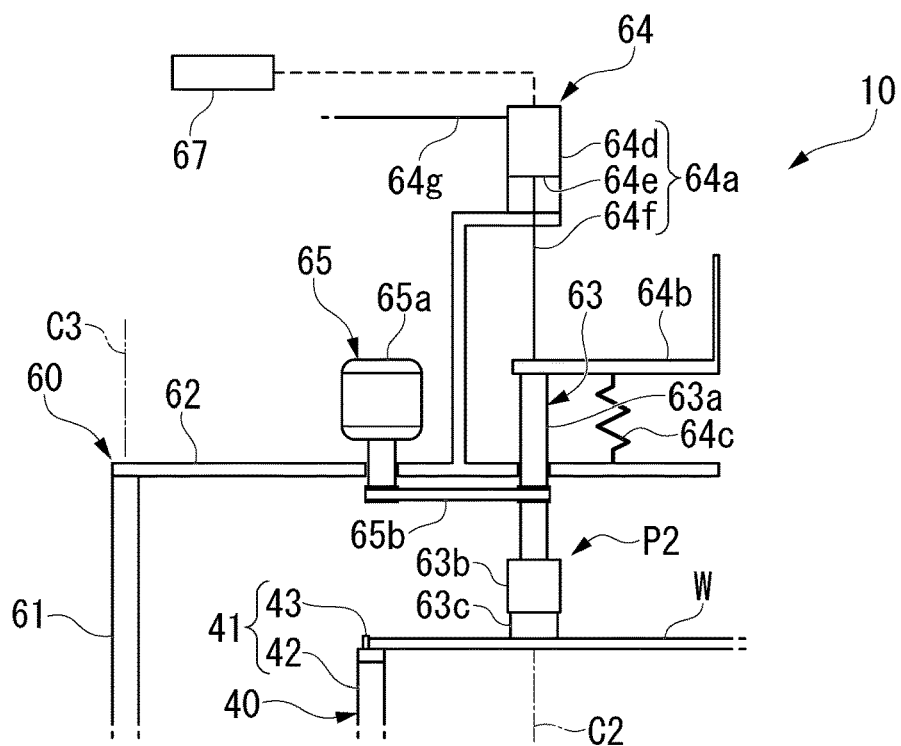
FIG. 4 is a schematic view for illustrating an operation of the cleaning tool and the lift mechanism.

FIG. 4 is a schematic view for illustrating the operation of the cleaning tool 63 and the lift mechanism 64.

As shown in FIGS. 3 and 4, the lift mechanism 64 adjusts the internal pressure of the cylinder 64d by adjusting the supply flow rate of the fluid from the fluid supplier (not shown) to the cylinder 64d, and moves the lift body 64e upward and downward.

For example, if the internal pressure of the space of the upper portion of the lift body 64e in the cylinder 64d is increased, the lift body 64e moves downward. If the internal pressure of the space of the lower portion of the lift body 64e is increased, the lift body 64e elevates. An electropneumatic regulator, for example, can be used to adjust the supply flow rate of the fluid.

The lift mechanism 64 raises and lowers the cleaning tool 63 (specifically, the cleaning member 63c) between a raised position P1 (see FIG. 3) separated from the wafer W and a lowered position P2 (see FIG. 4) in contact with the wafer W with respect to the arm 62. In a modified embodiment, the lift mechanism 64 vertically moves the entire arm 62 vertically based on a control signal from the controller 67, whereby the controller 67 can move the cleaning tool 63 vertically.

The cleaning tool rotation mechanism 65 includes a rotation driver 65a and a drive belt 65b. The rotation driver 65a is, for example, a motor. The rotation driver 65a is attached to the arm 62. The drive belt 65b transmits the driving force of the rotation driver 65a to the shaft portion 63a, and rotates the cleaning tool 63 around the axis (around the central axis C2).

As shown in FIG. 1, the arm rotator 66 is, for example, a motor. The arm rotator 66 rotates the arm 62 around the central axis C3 of the support column 61. The central axis C3 is parallel to the central axis C1.

Figure 5:
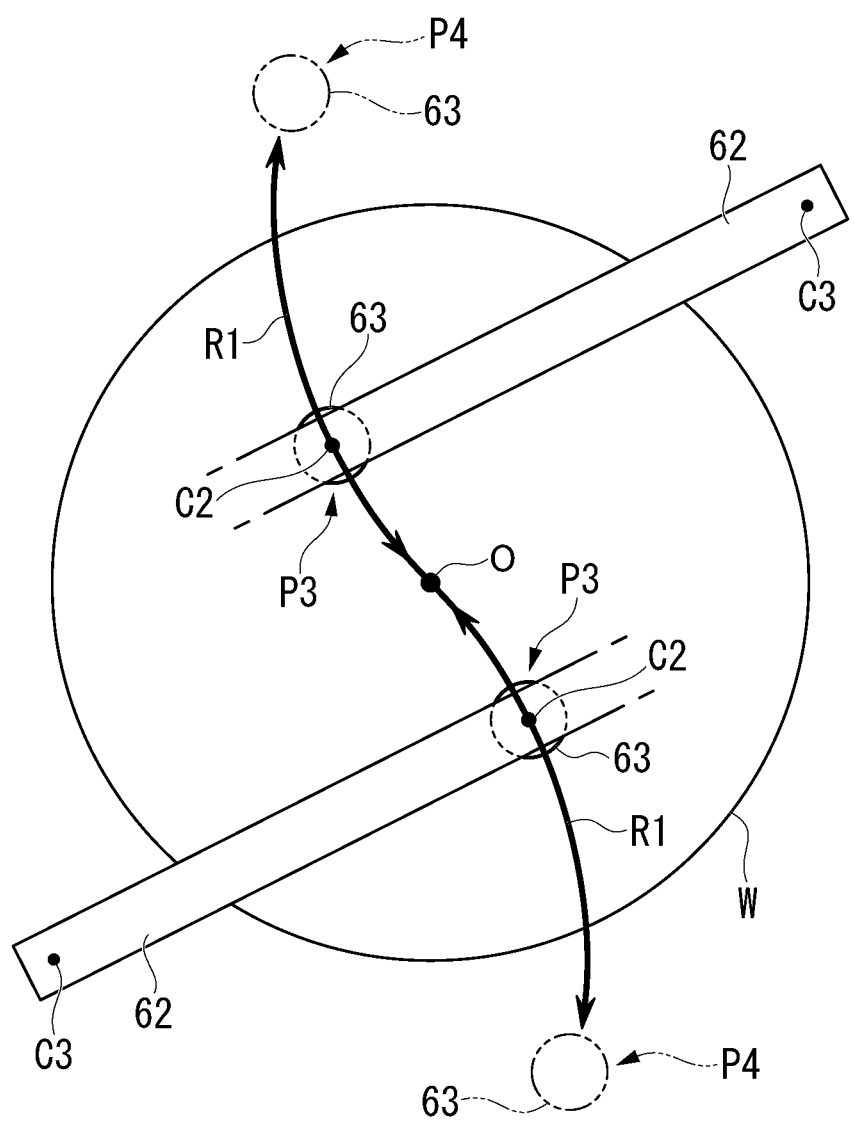
FIG. 5 is a schematic view illustrating an example of an operation of an arm.

FIG. 5 is a schematic view illustrating an example of the operation of the arm 62. FIG. 5 is a view (plan view) viewed from a direction parallel to the central axis C1. A symbol O shown in FIG. 5 is a center of the wafer W.

As shown in FIG. 5, the arm rotator 66 (see FIG. 1) moves the arm 62 between the washable position P3 and the retraction position P4 by rotating the arm 62 around the support column 61. The washable position P3 is a position where the cleaning tool 63 overlaps the wafer W in a plan view. The retraction position P4 is a position where the cleaning tool 63 is detached from the wafer W in a plan view. The cleaning tool 63 that moves between the washable position P3 and the retraction position P4 moves along an arcuate path R1 around the central axis C3. Note that the plan view refers to, for example, viewing parallel to the thickness direction of the wafer W. In the present embodiment, two cleaning tools 63 may be installed in one substrate cleaning apparatus by specifying a movable region (washable position P3 and retraction position P4) of the respective arm 62 of two cleaning tools 63 as shown in FIG. 5.

In the substrate cleaning apparatus 10, when the cleaning tool 63 is at the retraction position P4, the wafer W can be attached to and detached from the substrate holding mechanism 40.

As shown in FIG. 1, the controller 67 centrally controls the operation of the cleaning mechanism 60. The controller 67 controls the operations of the lift mechanism 64, the cleaning tool rotation mechanism 65, the arm rotator 66, and the like, for example, by controlling the computers (or controllers) associated with the cleaning tool 63. The controller 67 can control the speed at which the cleaning tool 63 descends by the lift mechanism 64. In one embodiment, during operation, the controller 67 enables data collection and feedback from the cleaning tool 63 to optimize performance of the substrate cleaning apparatus.

The cover 70 is formed in a cylindrical shape. The inner diameter of the cover 70 is larger than the outer diameter of the wafer W. The cover 70 can be arranged so as to surround the wafer W held by the substrate holding mechanism 40 from the outer peripheral side. A portion including the upper end of the cover 70 gradually decreases in diameter upward. The cover 70 can receive the spray of the cleaning liquid when the wafer W is rotated.

The cover 70 is configured to be vertically movable, and can switch between a raised position that surrounds the wafer W and a lowered position that deviates from the height position of the wafer W. In the raised position, the upper end of the cover 70 is higher than the wafer W.

Next, a method of cleaning the wafer W using the substrate cleaning apparatus 10 will be described with reference to FIGS. 1, 3 and 4.

As shown in FIG. 1, the wafer W is held by the substrate holding mechanism 40, and the wafer W is rotated around the central axis C1 by the rotation mechanism 50. A cleaning liquid is supplied to the surface of the wafer W from a cleaning liquid supply portion (not shown). As shown in FIG. 3, at this stage, the cleaning tool 63 is at the raised position P1 higher than the wafer W.

The arm rotator 66 rotates the arm 62 around the support column 61 as necessary, and arranges the arm 62 at a cleaning position P3 (position where the cleaning tool 63 overlaps the wafer W in plan view). The cleaning tool rotation mechanism 65 rotates the cleaning tool 63 around the central axis C2.

As shown in FIG. 4, the lift mechanism 64 raises the internal pressure of the cylinder 64*d* by adjusting the flow rate of the fluid supplied from the fluid supply portion (not shown) to the cylinder 64*d*, and lowers the lift body 64*e*. Since the cleaning tool 63 is connected to the lift body 64*e*, the cleaning tool 63 also descends in conjunction with the lift body 64*e*. The cleaning member 63*c* of the cleaning tool 63 contacts the upper surface of the wafer W. The position of the cleaning tool 63 at this time is referred to as the lowered position P2.

Since the support 64*b* is connected to the cleaning tool 63, the support 64*b* moves down together with the cleaning tool 63. Since the support body 64*b* moves downward to approach the arm 62, the biasing body 64*c* is compressed.

Figure 6:
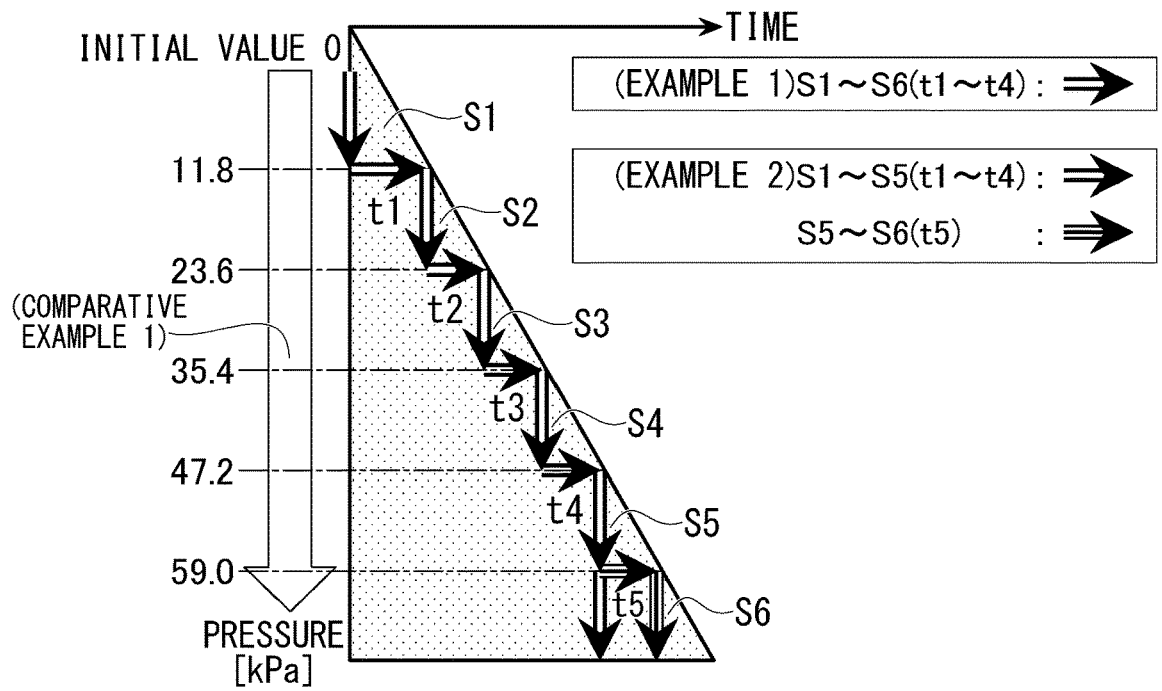
FIG. 6 is a diagram showing an example of changes in an internal pressure of a cylinder of the lift mechanism.

The controller 67 controls the speed at which the cleaning tool 63 descends by the lift mechanism 64. FIG. 6 is a diagram schematically showing three examples of changes over time in the internal pressure command value of the cylinder 64*d* transmitted from the control unit 67 to a pressure regulator (not shown) that adjusts the internal pressure of the cylinder 64*d* of the fluid supplier. In the figure, "double-line arrow only", "combination of double-line arrow and triple-line arrow", and "white arrow" respectively refer to the change in the internal pressure command value of the cylinder 64*d* of (Example 1), (Example 2), and (Comparative Example 1) described later. As shown in FIG. 6, in Examples 1 and 2 and Comparative Example 1, the controller 67 increases the internal pressure of the cylinder 64*d* in multiple stages (specifically, 5 or 6 stages) or in a continuous manner. At the initial stage, the cleaning tool 63 is in the raised position P1 (see FIG. 3), and the internal pressure of the cylinder 64*d* is 0 kPa (gauge pressure).

In the first stage S1, the internal pressure of the cylinder 64*d* is increased from 0 kPa to 11.8 kPa. In the second stage S2, the internal pressure of the cylinder 64*d* is increased from 11.8 kPa to 23.6 kPa. The average internal pressure of the cylinder 64*d* in the second step S2 is higher than the average internal pressure of the cylinder 64*d* in the first step S1. In the third stage S3, the internal pressure of the cylinder 64*d* is increased from 23.6 kPa to 35.4 kPa. The average internal pressure of the cylinder 64*d* in the third step S3 is larger than the average internal pressure of the cylinder 64*d* in the second step S2. In the fourth step S4, the internal pressure of the cylinder 64*d* is increased from 35.4 kPa to 47.2 kPa. The average internal pressure of the cylinder 64*d* in the fourth step S4 is higher than the average internal pressure of the cylinder 64*d* in the third step S3. In the fifth stage S5, the internal pressure of the cylinder 64*d* is increased from 47.2 kPa to 59.0 kPa. The average internal pressure of the cylinder 64*d* in the fifth step S5 is higher than the average internal pressure of the cylinder 64*d* in the fourth step S4. The rising speed of the internal pressure in each of the first step S1 to the fifth step S5 may be the same.

At the end of the fifth step S5, the cleaning tool 63 (specifically, the cleaning member 63*c*) approaches the wafer W, however has not yet contacted the wafer W.

The number of stages when the internal pressure of the cylinder 64*d* increases stepwise is not particularly limited, and may be any number of 2 or more.

When the steps increase from the first step S1 to the fifth step S5, a time interval tn (interval) can be provided. That is, the interval tn can be provided between the nth stage Sn and the (n+1)$^{th}$ stage Sn+1 (n: an integer of 1 to 4). The interval tn may be 0.1 seconds or more (for example, 0.1 seconds to 1 second). During the interval, the internal pressure of the cylinder 64*d* may be constant.

While the increase range of the internal pressure in each of the first step S1 to the fifth step S5 is constant, the elastic repulsive force of the biasing body 64*c* gets stronger as the cleaning tool 63 descends from the first step S1 to the fifth step S5. Therefore, the descending speed of the cleaning tool 63 gradually decreases in each stage. That is, the cleaning tool 63 is decelerated at each stage. When the interval is provided, the descending speed of the cleaning tool 63 gradually decreases.

There is no need for setting an interval when the steps are increased in the first step S1 to the fifth step S5. The internal pressure command value of the cylinder 64*d* may be continuously increased in proportion to time or may be increased stepwise. The descending speed of the cleaning tool 63 may continuously decrease from the first step S1 to the fifth step S5, or may gradually decrease.

After the end of the fifth step S5, the controller 67 further increases the internal pressure of the cylinder 64*d*. The internal pressure of the cylinder 64*d* shifts to the sixth stage S6 after the fifth stage S5. In the sixth step S6, the internal pressure of the cylinder 64*d* is increased from 59.0 kPa to, for example, 74.9 kPa. The average internal pressure of the cylinder 64*d* in the sixth step S6 is higher than the average internal pressure of the cylinder 64*d* in the fifth step S5.

The cleaning tool 63 (specifically, the cleaning member 63*c*) reaches the lowered position P2 and contacts the wafer W in the sixth step S6. In the process from the raised position P1 to the lowered position P2, the descending speed of the cleaning tool 63 is the lowest at the lowered position P2. At the lowered position P2, the elastic force of the cleaning member 63*c* due to the contact with the wafer W applies an upward repulsive force to the cleaning tool 63. An elastic repulsive force in the upward direction is also applied to the cleaning tool 63 by the biasing body 64*c*.

There may be a time interval (interval) t5 between the fifth step S5 and the sixth step S6. This interval t5 may be 0.3 seconds or more (for example, 0.3 seconds to 1 second). At the interval t5, the internal pressure of the cylinder 64d may not change and may be constant. The interval t5 between the fifth step S5 and the sixth step S6 is preferably longer than the intervals t1 to t4 from the first step S1 to the fifth step S5.

When the stroke of the descending motion of the cleaning tool is large, the load applied to the wafer when the cleaning tool contacts the wafer tends to increase.

In the substrate cleaning apparatus 10 shown in FIG. 1 and the like, since the column 61 does not have a telescopic mechanism or the like, the height of the arm 62 does not fluctuate, so that the cleaning tool 63 is lowered only by the lift mechanism 64. Therefore, it can be said that the substrate cleaning apparatus 10 has a structure in which the stroke of the cleaning tool 63 easily increases. However, the substrate cleaning apparatus 10 can control the speed at which the cleaning tool 63 descends by the controller 67. Therefore, the speed at which the cleaning tool 63 contacts the wafer W can be reduced, and the load applied to the wafer W can be suppressed. Therefore, the damage of the wafer W can be prevented.

In the substrate cleaning apparatus 10, the structure of the support column 61 of the cleaning mechanism 60 is simple Therefore, the structure for supporting the cleaning tool 63 can be downsized, and the installation space can be reduced. Therefore, the cleaning performance can be improved by adding a new cleaning mechanism to the empty space. The substrate cleaning apparatus 10 can also reduce the cost because the structure of the support columns 61 of the cleaning mechanism 60 is simple.

In the substrate cleaning apparatus 10, the controller 67 can control the speed at which the cleaning tool 63 descends. Therefore, the descending speed of the cleaning tool 63 before reaching the wafer W (for example, the descending speed from the first step S1 to the fourth step S4) can be increased to improve the efficiency of the cleaning process.

As shown in FIG. 6, the internal pressure of the cylinder 64d is increased stepwise. Therefore, as compared with the case where the internal pressure of the cylinder 64d is increased steplessly, the descending speed of the cleaning tool 63 at the time when the cleaning tool 63 approaches the wafer W (at the end of the fifth step S5) is suppressed. Therefore, the cleaning tool 63 can be prevented from colliding with the wafer W due to inertia.

The substrate cleaning apparatus 10 shown in FIG. 1 includes a cover 70 that surrounds the wafer W. Therefore, in order to clean the wafer W, when the cleaning tool 63 is moved from the retraction position P4 to the cleanable position P3, it is necessary to dispose the cleaning tool 63 higher and cross the cover 70. Therefore, the stroke for lowering the cleaning tool 63 becomes large. As described above, a large stroke of the cleaning tool is likely to be disadvantageous in terms of the load applied to the wafer. However, in the substrate cleaning apparatus 10, the controller 67 can control the speed at which the cleaning tool 63 descends. Therefore, the speed when the cleaning tool 63 contacts the wafer W can be an appropriately controlled speed (reduced speed), and the load applied to the wafer W when the cleaning tool 63 contacts the wafer W can be suppressed. Therefore, the damage of the wafer W can be prevented.

Also by the above, it is possible to continuously perform the cleaning processing of a plurality of substrates while ensuring the availability of the substrate cleaning apparatus 10, and it is possible to increase the operation rate of the apparatus.

The lift mechanism 64 includes a fluid supply portion (not shown), a cylinder 64d to which the fluid is supplied, and an lift body 64e that adjusts the height of the cleaning tool 63 according to the pressure of the fluid in the cylinder 64d. Therefore, the internal pressure of the cylinder 64d can be adjusted by adjusting the flow rate of the fluid supplied to the cylinder 64d, and the lift body 64e can be moved vertically. Therefore, the device configuration can be simplified. Further, the descending speed of the cleaning tool 63 can be controlled accurately.

The controller 67 controls the descending speed of the cleaning tool 63 by adjusting the flow rate of the fluid supplied to the cylinder 64d. Therefore, the descending speed of the cleaning tool 63 can be accurately determined.

The lift mechanism 64 includes a biasing body 64c. Therefore, the descending speed of the cleaning tool 63 can be controlled with a simple configuration.

The arm 62 can switch between the washable position P3 and the retracted position P4. Therefore, when the cleaning tool 63 is at the retraction position P4, the wafer W can be attached to and detached from the substrate holding mechanism 40. Therefore, the workability of cleaning the wafer W can be improved.

The substrate cleaning apparatus 10 includes a plurality (for example, two) of cleaning mechanisms 60. Therefore, the efficiency of cleaning the wafer W can be improved.

Figure 7:
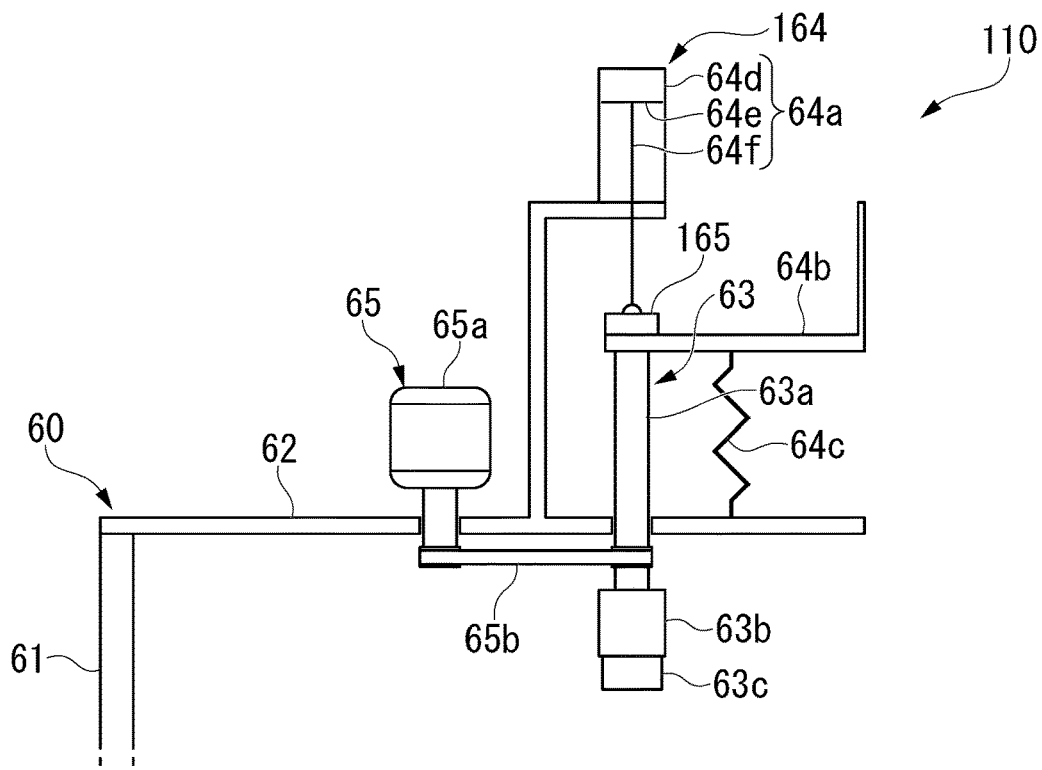
FIG. 7 is a schematic view of a cleaning tool and a lift mechanism of the substrate cleaning apparatus of the second embodiment.

FIG. 7 is a schematic view of the cleaning tool 63 and the lift mechanism 164 used in the substrate cleaning apparatus 110 of the second embodiment. The explanation of the same components as those of the substrate cleaning apparatus 10 shown in FIG. 3 are omitted with the same reference symbols.

The lift mechanism 164 differs from the lift mechanism 64 shown in FIG. 3 in that a load cell 165 is provided between the support body 64b and the connection portion 64f.

The lift mechanism 164 includes a load cell 165. For example, by detecting the load by the load cell 165, based on the measured load value based on the relational expression showing the correlation between the load value stored in advance in the load cell or the control unit 67 and the position P2 of the cleaning tool 63, the position of the cleaning tool can be specified from the measured load value. In addition, when there is a deviation between the target value of the position of the cleaning tool and the position of the cleaning tool, a signal may be transmitted from the control unit 67 to change the position of the cleaning tool, thereby the lift mechanism 164 can be operated. Therefore, the cleaning tool 63 (specifically, the cleaning member 63c) can always grasp the lowered position P2 at which the cleaning tool 63 contacts the wafer W and correct the position. Therefore, it becomes easy to manage the increase value of the load applied to the wafer W by the cleaning tool 63.

EXAMPLES

Hereinafter, it will be described based on Examples and Comparative Examples that the load applied to the wafer W can be suppressed when the substrate cleaning apparatus 10 shown in FIG. 1 is used.

Example 1

Using the substrate cleaning apparatus 10 shown in FIG. 1, the wafer W was cleaned under the following conditions.

The wafer W was rotated by the rotation mechanism 50, and as shown in FIG. 6, the controller 67 increased the internal pressure of the cylinder 64d in five stages. The internal pressure of the cylinder 64d was shifted to the sixth stage S6 after the fifth stage S5. The cleaning tool 63 was brought into contact with the wafer W in the sixth step S6. The interval t1 to t4 when the step increases by one from the first step S1 to the fifth step S5 is 0.1 second in common. No interval was set between the fifth stage S5 and the sixth stage S6.

Figure 8:
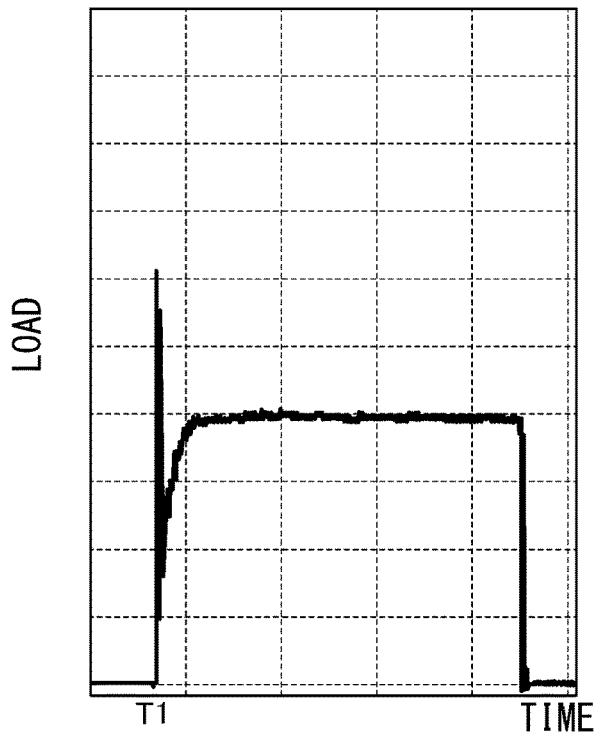
FIG. 8 is a diagram showing a load applied to the substrate in Example 1.

FIG. 8 is a diagram showing a load applied to the wafer W in Example 1. As shown in FIG. 8, the load applied to the wafer W increased when the cleaning tool 63 contacted the wafer W (T1), however the increase value was not high.

Example 2

The wafer W was cleaned in the same manner as in Example 1 except that the interval t5 of 0.3 seconds was set between the fifth step S5 and the sixth step S6.

Figure 9:
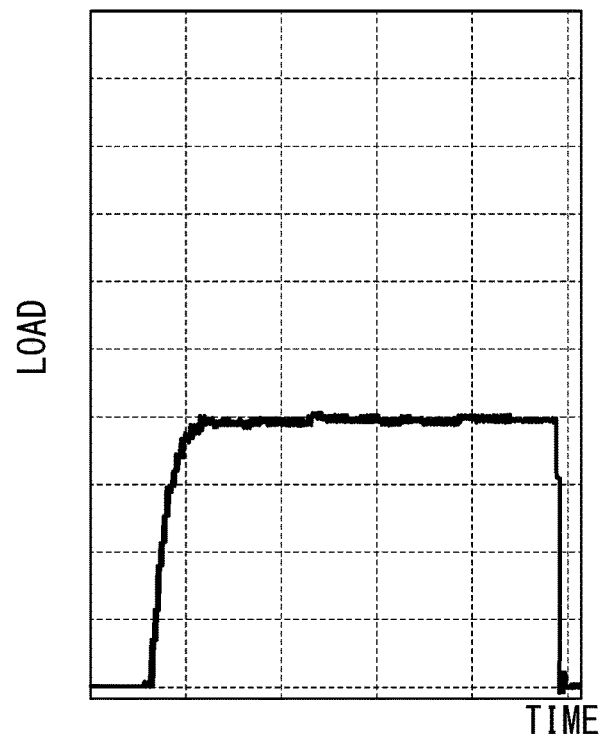
FIG. 9 is a diagram showing a load applied to the substrate in Example 2.

FIG. 9 is a diagram showing a load applied to the wafer W in Example 2. As shown in FIG. 9, the load applied to the wafer W did not increase significantly when the cleaning tool 63 contacts the wafer W.

Comparative Example 1

The internal pressure of the cylinder 64d above was raised at a time from zero of Symbol early stages to a maximum value of the sixth stage S6 (stepless). As a result, the cleaning tool descended at a much higher descending speed than in Examples 1 and 2 until just before the cleaning tool contacted the wafer. The other operations were the same as in Example 1.

Figure 10:
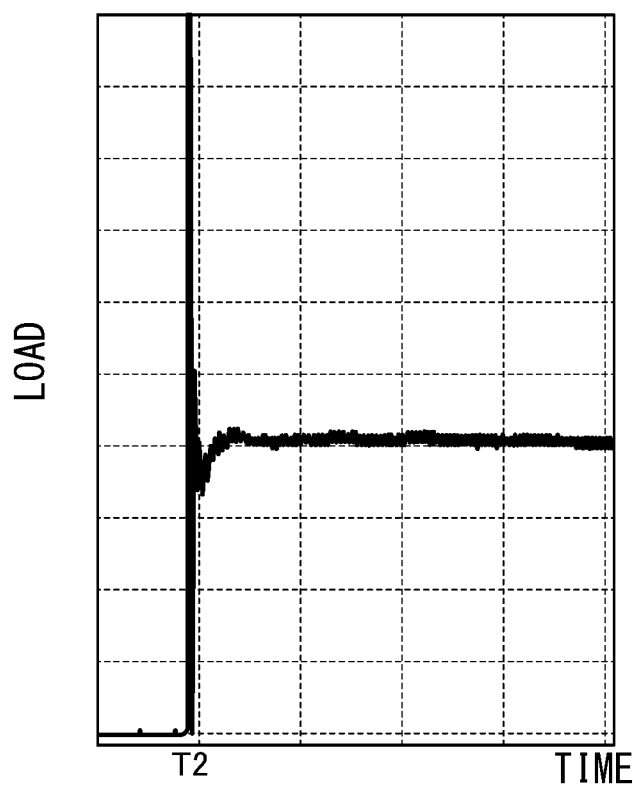
FIG. 10 is a diagram showing a load applied to the substrate in Comparative Example 1.

FIG. 10 is a diagram showing a load applied to the wafer in Comparative Example 1. As shown in FIG. 10, the load applied to the wafer increased significantly when the cleaning tool contacted the wafer (T2). The increase in load was very large.

As shown in FIGS. 8 to 10, in Examples 1 and 2 using the substrate cleaning apparatus 10 shown in FIG. 1, the load applied to the wafer W when the cleaning tool 63 was in contact with the wafer W could be suppressed. In particular, in Example 2, the increase in the load applied to the wafer W could be reduced.

The present invention is not limited to the above-described embodiment, and various modifications can be made without departing from the gist of the present invention. For example, the configuration of the lift mechanism is not limited to the above configuration. The cleaning tool may be moved up and down by a lift mechanism using a ball screw, a servo motor, or the like. The cleaning tool may be a pad made of a resin material or a brush cleaning member.

In the above-described cleaning method, the speed at which the cleaning tool descends from the raised position to the lowered position gradually decreases, however the change in the descending speed of the cleaning tool is not limited to this. For example, the cleaning tool may descend at a constant first speed from the raised position to immediately before the lowered position, and then may descend at a second speed lower than the first speed until the cleaning tool contacts the wafer.

In order to adjust the flow rate of the fluid supplied to the cylinder, the opening degree of a valve (not shown) provided in the fluid supply path may be adjusted.

The number of cleaning mechanisms provided in the substrate cleaning apparatus is not limited to two, and may be one or any number of three or more.

In the above-described embodiments, the substrate processing apparatus is a polishing apparatus for polishing a wafer; however, another substrate processing apparatus may be configured by replacing the plurality of polishers with another substrate processing portion. Examples of the "other substrate processing portion" include a film forming processing portion (plating processing portion, CVD portion, and the like), a wet etching portion, a dry etching portion, and the like. In addition, a plurality of different substrate processing portions may be combined. Furthermore, other examples of the polishing apparatus may be adopted such as grinding a substrate or a back-side polisher of a substrate.

The primary cleaning module 201 and the secondary cleaning module 202 shown in FIG. 2 may have different configurations. A roll-cleaning-type cleaning device may be adopted as the primary cleaning module. The roll-cleaning-type cleaning device includes roll-type cleaning tools (roll sponges) on both sides of the substrate. The roll-cleaning-type cleaning device can perform scrub cleaning both sides of the substrate using the cleaning tool.

The control unit 67 shown in FIG. 3 may obtain a signal to reach the set internal pressure (the internal pressure command value) of the cylinder 64d at each stage from a pressure sensor (not shown) connected in communication from the inside of the cylinder 64d. The controller 67 may further wait for a predetermined interval time and then issue a command signal to the pressure regulator of the fluid supply unit so as to reach the set internal pressure of the next stage.

In addition, as one of the embodiments, the substrate cleaning apparatus may include a substrate holder that rotatably holds the substrate in a vertical direction on a first axis, and a cleaning member supported by an arm that faces the substrate held by the substrate holder, a driver (actuator and the like) driving the cleaning member so that the cleaning member can move closer to and away from the substrate, and a driver which makes the cleaning member is movable on a plane parallel to the substrate surface.

Furthermore, as one of the embodiments, a substrate processing apparatus may be provided which does not include a substrate polishing apparatus in the apparatus; however includes a substrate cleaning apparatus for cleaning and drying a substrate which has been subjected to dry processing.

Further, in a modified embodiment, the cleaning tool 63 is brought into contact with the substrate W while rotating the cleaning tool 63 in advance, and then the load is changed by the load cell to detect the "torque". While detecting the torque, the speed at which the cleaning tool 63 descends may be controlled so that the vertical position of the cleaning tool may be changed based on the measured value. As a result, the increased value of the load applied to the wafer W by the cleaning tool 63 may be managed.

Furthermore, the effects described in this specification are merely examples and are not limited, and there may be other effects.

Although the preferred embodiments of the present invention have been described above, the present invention is not limited to these embodiments and examples. Additions, omissions, substitutions, and other changes can be made to the configuration without departing from the spirit of the present invention. The invention is not limited by the above description, but only by the scope of the appended claims.

What is claimed is:

1. A substrate cleaning apparatus comprising:
a substrate holding mechanism holding a substrate;
a rotation mechanism rotating the substrate held by the substrate holding mechanism; and
a cleaning mechanism cleaning the substrate, wherein the cleaning mechanism comprises:

a support column;

an arm extending from the support column and having a fixed height position;

a cleaning tool supported by the arm and cleaning a surface of the substrate by contacting the surface;

a cylinder which is connected to the arm and lowers the arm;

a lift mechanism moving the cleaning tool vertically with respect to the arm between a raised position separated from the substrate and a lowered position in contact with the substrate, and comprises a biasing body which is connected to the arm such that when a load is applied downward, a repulsive force is applied to the arm; and a controller controlling at least a speed at which the cleaning tool descends.

2. The substrate cleaning apparatus according to claim 1, further comprising a cover surrounding the substrate from an outer peripheral side.

3. The substrate cleaning apparatus according to claim 1, wherein the lift mechanism comprises a fluid supplier that supplies a fluid to the cylinder, and a lift body that adjusts a height of the cleaning tool in accordance with a pressure of the fluid in the cylinder.

4. The substrate cleaning apparatus according to claim 3, wherein the controller controls a speed at which the cleaning tool descends by adjusting a supply amount of the fluid to the cylinder.

5. The substrate cleaning apparatus according to claim 1, wherein by rotating around the support column, the arm is able to switch between a cleaning position where the cleaning tool overlaps the substrate when viewed parallel to the thickness direction of the substrate and a retracted position where the cleaning tool is detached from the substrate.

6. The substrate cleaning apparatus according to claim 1, further comprising a plurality of the cleaning mechanisms.

7. A substrate processing apparatus comprising:

a substrate polishing apparatus polishing a substrate; and the substrate cleaning apparatus according to claim 6, which cleans the substrate polished by the substrate polishing apparatus.

8. A substrate cleaning method for cleaning a substrate using the substrate cleaning apparatus according to claim 1, wherein the controller controls the speed at which the cleaning tool descends from the raised position to the lowered position so as to be gradually or continuously reduced.

9. A substrate cleaning apparatus comprising:

a substrate holding mechanism holding a substrate;

a rotation mechanism rotating the substrate held by the substrate holding mechanism; and a cleaning mechanism cleaning the substrate, wherein the cleaning mechanism comprises:

a support column;

an arm extending from the support column and having a fixed height position;

a cleaning tool supported by the arm and cleaning a surface of the substrate by contacting the surface;

a lift mechanism moving the cleaning tool vertically with respect to the arm between a raised position separated from the substrate and a lowered position in contact with the substrate; and a controller controlling at least a speed at which the cleaning tool descends, wherein the lift mechanism comprises a fluid supplier that supplies a fluid, a cylinder to which the fluid is supplied, and a lift body that adjusts a height of the cleaning tool in accordance with a pressure of the fluid in the cylinder, and wherein the lift mechanism further comprises a biasing body biasing the lift body in a direction opposite to a moving direction of the lift body when a pressure of the fluid increases.

* * * * *